United States Patent [19]

Ito

[11] 4,239,559
[45] Dec. 16, 1980

[54] METHOD FOR FABRICATING A SEMICONDUCTOR DEVICE BY CONTROLLED DIFFUSION BETWEEN ADJACENT LAYERS

[75] Inventor: Satoru Ito, Tokyo, Japan

[73] Assignee: Hitachi, Ltd., Japan

[21] Appl. No.: 30,812

[22] Filed: Apr. 17, 1979

[30] Foreign Application Priority Data

Apr. 21, 1978 [JP] Japan .................................. 53-46531
Apr. 24, 1978 [JP] Japan .................................. 53-47763
Apr. 24, 1978 [JP] Japan .................................. 53-47764
Apr. 24, 1978 [JP] Japan .................................. 53-47766

[51] Int. Cl.³ .................... H01L 21/225; H01L 21/31
[52] U.S. Cl. ...................................... 148/188; 29/578; 148/174; 148/187; 148/191; 156/628; 156/649; 156/657; 156/662; 357/23; 357/24; 357/59; 427/85; 427/331; 427/333; 427/372.2
[58] Field of Search .............. 148/174, 187, 188, 191; 29/578; 156/628, 648, 649, 657, 662; 357/23, 24, 59; 427/85, 86, 93, 331, 333, 372 R, 372 A

[56] References Cited

U.S. PATENT DOCUMENTS

| | | | |
|---|---|---|---|
| 3,738,880 | 6/1973 | Laker | 148/188 X |
| 3,832,247 | 8/1974 | Saddler et al. | 148/175 |
| 3,980,507 | 9/1976 | Carley | 156/628 X |
| 4,026,740 | 5/1977 | Owen | 156/657 X |
| 4,057,895 | 11/1977 | Ghezzo | 156/628 X |
| 4,084,987 | 4/1978 | Godber | 148/188 X |
| 4,124,933 | 11/1978 | Nicholas | 148/174 X |
| 4,148,054 | 4/1979 | Hart et al. | 148/188 X |

*Primary Examiner*—L. Dewayne Rutledge
*Assistant Examiner*—W. G. Saba
*Attorney, Agent, or Firm*—Craig and Antonelli

[57] ABSTRACT

A method for fabricating a semiconductor device is disclosed, which comprises forming a first polycrystalline silicon film containing an impurity such as phosphorus or boron on the surface of a silicon oxide film, forming an impurity-free second polycrystalline silicon film contiguous to the first polycrystalline silicon film, diffusing the impurity contained in the first polycrystalline silicon film into the second polycrystalline silicon film to form an impurity-containing region, and oxidizing the impurity-containing region to electrically separate the first and second polycrystalline silicon films from each other by the resulting oxide.

23 Claims, 54 Drawing Figures

METHOD FOR FABRICATING A SEMICONDUCTOR DEVICE BY CONTROLLED DIFFUSION BETWEEN ADJACENT LAYERS

BACKGROUND OF THE INVENTION

The present invention relates to a method for fabricating a semiconductor device.

Various photoresist masking treatments have heretofore been proposed and practised for formation or semiconductor devices. For example, electrodes or wiring layers are selectively formed by such photoresist masking treatment. In the art of semiconductor integrated circuits, there is recently observed a tendency to reduce areas occupied by elements such as transistors and decrease the sizes of electrodes or wiring layers. For this purpose, it is necessary to remarkably diminish a spacing between adjoining electrodes or wiring layers.

However, in the case where electrodes or the like are formed according to the above-mentioned photoresist masking treatment, since margins for the mask alignment are necessary, it is impossible to form electrodes having a high size precision or maintain a precise spacing between adjoining electrodes disposed closely to each other. Therefore, semiconductor devices having minute and precise sizes or dimensions cannot be prepared according to these conventional photoresist masking treatments.

As the semiconductor device in which the electrode spacing is narrowed as much as possible so as to increase the operation speed, there is known a charge coupled device (hereinafter referred to as "CCD"). In connection with formation of electrodes in this semiconductor device, a method for reducing a spacing between electrodes by utilizing a technique of oxidizing the surfaces of electrodes is known from Japanese Patent Application Laid-Open Specification No. 15078/72. According to this method, a first electrode is selectively formed on a semiconductor substrate on the surface of which an oxide film has been formed, and then, a second electrode is formed on the semiconductor substrate so that the second electrode is partially superimposed on the first electrode. In this method, the electrode spacing is defined by the thickness of the oxide film on the side of the first electrode. The second electrode is selectively etched at the portion superimposed on the first electrode, and a photoresist masking treatment is necessary for this selective etching. Accordingly, it is impossible to reduce the size of this superimposed portion at a high precision, and therefore, the capacity of the capacitor at the superimposed portion is increased. Consequently, it is impossible to obtain high-speed CCD.

SUMMARY OF THE INVENTION

It is a primary object of the present invention to provide a method for fabricating a semiconductor device having a electrode or a wiring layer formed at a high precision.

Another object of the present invention is to provide a method for fabricating a high-density semiconductor device.

In accordance with the present invention, there is provided a method for fabricating a semiconductor device, which comprises the steps of selectively forming an impurity-containing layer on a semiconductor substrate, forming a semiconductor layer on the semiconductor substrate in other region contiguous to the impurity-containing layer and doping the impurity of the impurity-containing layer into the semiconductor layer to selectively form an impurity-containing semiconductor region, wherein the spacing between the impurity-containing layer and the semiconductor layer is defined by the impurity-doped semiconductor region.

Physical properties of the impurity-doped semiconductor region are different from those of the semiconductor layer in other region. Accordingly, if this difference of physical properties is utilized, it is possible to form electrodes or wiring layers at a high precision only by an etching or oxidizing treatment without performing photoresist masking. Only control of doping of the impurity from the impurity-containing layer is necessary for determining the size of the electrodes or wiring layers, and various steps necessary for the photoresist masking treatment, such as mask registering, exposure, development and etching, can be omitted.

DETAILED DESCRIPTION OF THE PREFERRED EMBODIMENTS

The present invention will now be described in detail by reference to the following Examples.

EXAMPLE 1

The method of a semiconductor device according to one embodiment of the present invention will now be described in sequence of the steps by reference to FIGS. 1 through 5.

Step (1)

Figure 1:
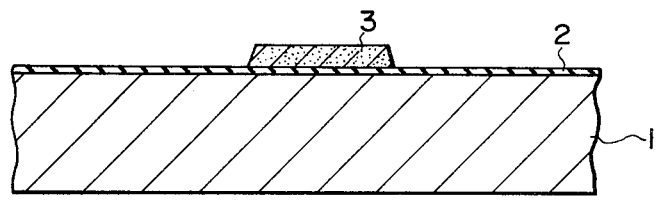
FIGS. 1 through 5 are sectional views showing the steps of one embodiment of the present invention.

A semiconductor substrate 1 having a silicon oxide film 2 formed on the surface thereof is prepared, and a polycrystalline silicon film 3 is formed partially on the surface of the silicon oxide film 2 (see FIG. 1). In the present invention, various substrates can be used. For example, a substrate obtained by forming a silicon oxide film 2 on a silicon substrate having a bipolar type or field effect type semiconductor (transistor) having a PN junction, a substrate obtained by forming on a saphire substrate a region of a semiconductor having a PN junction for constituting a semiconductor element and forming an insulating film on this semiconductor region, and a silicon substrate, having a silicon epitaxial layer may be used in the present invention.

The polycrystalline silicon film 3 is formed by the chemical vapor deposition method (hereinafter referred to as "CVD method"). For example, the polycrystalline silicon film 3 is formed at a reaction temperature of about 650° C. by using a reaction gas of $SiH_4+N_2$. The thickness of the silicon film 3 is about 4000 Å. The silicon film 3 is processed to have a predetermined pattern according to a customary photoresist masking treatment.

Figure 2:
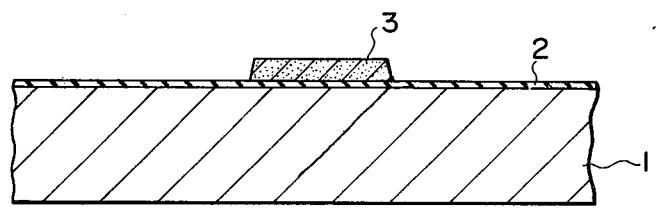

After or before the formation of the pattern, arsenic is doped in the polycrystalline silicon film at a concentration of $5 \times 10^{20}$ atoms/cm$^3$ (see FIG. 2). Instead of arsenic, phosphorus or boron can be used as the impurity to be doped. In the present invention, the impurity-doped polycrystalline silicon film 3 also acts as an impurity diffusion source.

Step (2)

Figure 3:
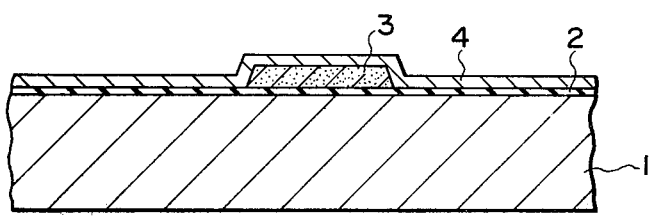

A non-doped polycrystalline silicon film 4 having a thickness of about 2000 Å is formed on the entire surface according to the CVD method or the like (see FIG. 3).

Step (3)

Figure 4:
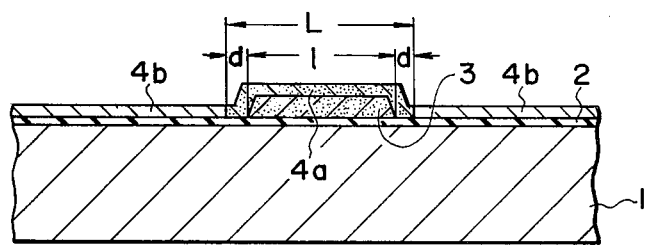

A heat treatment is carried out, for example, at 950° C. in a nitrogen atmosphere for 30 minutes, to diffuse arsenic impurity into the polycrystalline silicon film 4 from the arsenic-doped polycrystalline silicon film 3 and thus form an arsenic-containing polycrystalline silicon region 4a (see FIG. 4). At this step, there may also be adopted a method in which the surface of the polycrystalline silicon film 4 is subjected in advance to light oxidation, for example, at 900° C. in a dry oxygen atmosphere for 30 minutes to form a thin film of silicon oxide on the surface of the polycrystalline silicon film 4 and the heat treatment is then carried out to form an arsenic-containing polycrystalline silicon region 4a. This silicon oxide film is formed to prevent arsenic from diffusing out from the arsenic-doped polycrystalline silicon film 3a at the surface of the polycrystalline silicon region 4a. When the polycrystalline silicon region 4b is used as an electrode or wiring layer, after the abovementioned heat treatment, an impurity such as arsenic is simultaneously doped into the polycrystalline silicon regions 4a and 4b, whereby the resistance of the polycrystalline silicon region 4b is reduced. Accordingly, this region 4b can be used as an electrode or wiring layer. In this case, however, it is important that the impurity concentration in the polycrystalline silicon region 4b should be lower than the impurity concentration in the polycrystalline silicon region 4a.

Step (4)

Figure 5:
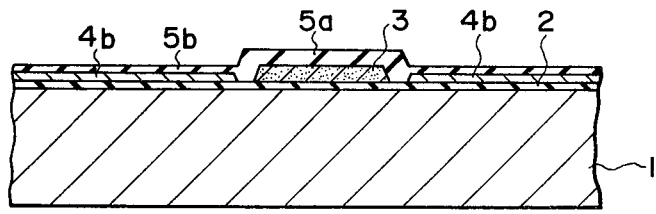

The polycrystalline silicon regions 4a and 4b are subjected to heat oxidation, for example, at 750° C. in a wet oxygen atmosphere for 5 hours, to completely heat-oxidize the region 4a and form a silicon oxide film 5a (see FIG. 5). At this step, also the surface portion of the polycrystalline silicon region 4b is slightly oxidized to form a thin film 5b of silicon oxide. The difference of the thickness between the silicon oxide films 5a and 5b is brought about by utilizing the difference of the physical property between the polycrystalline silicon regions 4a and 4b. More specifically, the oxidation speed in the polycrystalline silicon region 4a containing the impurity is higher than the oxidation speed in the polycrystalline silicon region 4b free of the impurity. In short, the above difference of the thickness is manifested by utilizing the difference of the oxidation speed between the two polycrystalline silicon regions, which is due to the difference of the impurity concentration.

Instead of the polycrystalline silicon film 3 used in this Example, there may be used a polycrystalline silicon film containing a high-melting-point metal such as platinum or molybdenum as an impurity. Furthermore, a polycrystalline silicon film containing such high-melting-point impurity metal may be used as the polycrystalline silicon film 4. In this case, an impurity other than the high-melting-point metal impurity is incorporated in the polycrystalline silicon film 3. Moreover, monocrystalline silicon films formed directly on the surface of a silicon or saphire substrate may be used as the polycrystalline silicon films 3 and 4.

In this Example, as is seen from FIG. 4, the spacing between the polycrystalline silicon film 3 and the impurity-free polycrystalline silicon region 4b is defined by the polycrystalline silicon region 4a containing the impurity diffused from the polycrystalline silicon film 3. More specifically, in FIG. 4, the size L of the region 4a is determined by the size l of the arsenic-doped polycrystalline silicon film 3 and the diffusion length d of arsenic in the lateral direction. This diffusion length d can easily be controlled according to heat treatment conditions such as the heat treatment temperature and time or the kind of the impurity. Namely, since the length d of the polycrystalline silicon region 4a is determined depending on the position of the polycrystalline silicon film 3 by self-alignment, the size L can be controlled at s high precision according to the size l. In other words, the spacing d between the polycrystalline silicon film 3 and the polycrystalline silicon region 4b can easily be controlled at a high precision.

EXAMPLE 2

In this Example, the method for preparing a CCD (charge coupled device) according to another embodiment of the present invention will be illustrated by reference to FIGS. 6 through 11 showing the steps of this embodiment.

Step (1)

Figure 6:
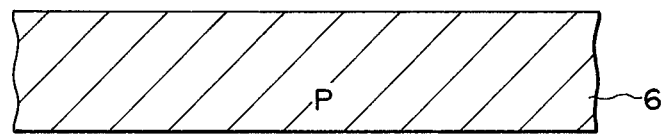
FIGS. 6 through 11 are sectional views showing the steps for preparing CCD according to the present invention.

A P-type silicon substrate 6 having a specific resistance of 10 Ω-cm and a crystal face (100) is prepared (see FIG. 6).

Step (2)

The surface of the silicon substrate 6 is heat-oxidized at 1000° C. in a dry oxygen atmosphere for about 120 minutes to form a gate silicon oxide film 7 having a thickness of 800 Å on the surface of the silicon substrate.

Step (3)

In order to form an N⁻ type layer on the surface of the silicon substrate 6, an impurity ion of phosphorus is injected into the substrate 6 through the silicon oxide film 7 according to the ion implantation technique. The injection energy is 100 KeV and the dose of phosphorus is $1 \times 10^{12}$ atoms/cm². Then, the annealing treatment is carried out at 1000° C. in a nitrogen atmosphere for about 100 minutes. As a result, an N⁻ type layer is formed.

Step (4)

Figure 7:
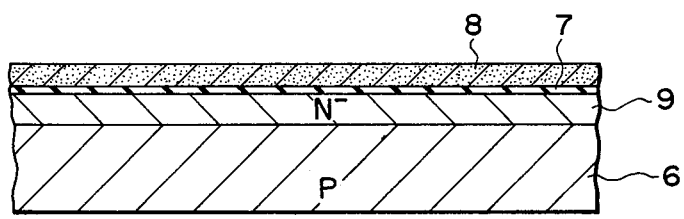

A polycrystalline silicon film having a thickness of about 3000 Å is formed on the surface of the gate silicon oxide film 7 according to the CVD method, and phosphorus is thermally diffused into the polycrystalline silicon film, to form a phosphorus-doped polycrystalline silicon film 8 having an impurity concentration of $1 \times 10^{21}$ atoms/cm³ (see FIG. 7).

Step (5)

Figure 8:
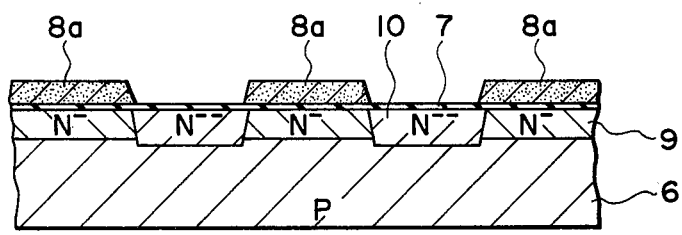

The phosphorus-doped polycrystallined silicon film 8 is selectively removed by the photoresist masking treatment to form a gate electrode 8a (see FIG. 8).

Step (6)

An impurity ion of boron is injected into the N⁻ type layer 9 through the surface-exposed gate silicon oxide film 7. The injection energy is 100 KeV and the dose of boron is $2 \times 10^{11}$ atoms/cm². Then, the annealing treatment is carried out at 1000° C. for 40 minutes and as a result, the N⁻ type layer 9 is countervailed by boron as the P-type impurity and an N⁻ layer 10 having a lower concentration than the N⁻ type layer 9 is formed (see FIG. 8).

Step (7)

Figure 9:
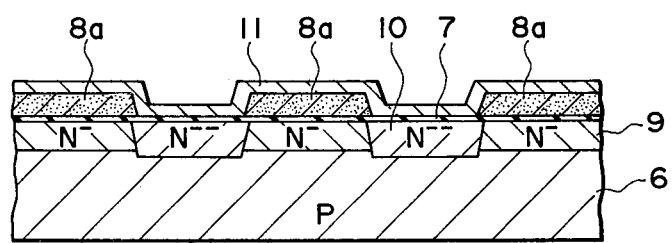

A polycrystalline silicon film 11 having a thickness of about 2000 Å is formed on the entire surface (see FIG. 9).

Step (8)

Figure 10:
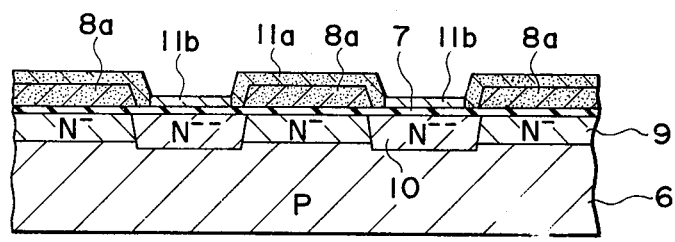

The heat treatment is carried out at 950° C. in a nitrogen atmosphere for 30 minutes to diffuse the phosphorus impurity contained in the gate electrode 8a into the polycrystalline silicon film 11 contiguous to the gate electrode 8a to form a phosphorus-doped polycrystalline silicon region 11a (see FIG. 10).

Step (9)

Figure 11:
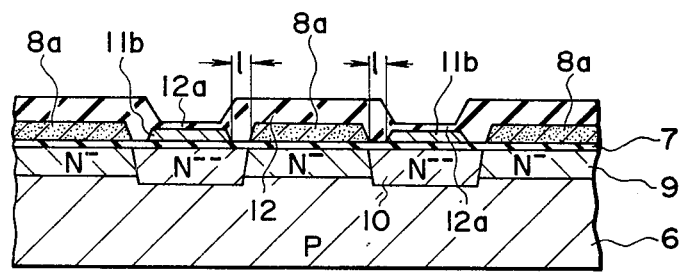

The surfaces of the polycrystalline silicon region 11b in which phosphorus has not been diffused and the phosphorus-diffused polycrystalline silicon region 11a are subjected to low temperature oxidation at 750° C. in a wet oxygen atmosphere for 8 hours to form a silicon oxide film 12 which electrically separates the gate electrode 8a from the polycrystalline silicon region 11b (see FIG. 11). The oxidation speed in the phosphorus-doped polycrystalline silicon region 11a to be used as a gate electrode is higher than the oxidation speed in the non-doped polycrystalline silicon region 11b. Accordingly, the polycrystalline silicon region 11a between the polycrystalline silicon region 11b and the gate electrode 8a is converted to silicon oxide. The width l of the silicon oxide film 12 between the polycrystalline silicon region 11b and the gate electrode 8a corresponds to the length of thermal diffusion of phosphorus from the gate electrode 8a to the polycrystalline silicon film 11 as the second layer. This width l, therefore, can be controlled according to conditions of the heat treatment of the step (8), and the width l can be sufficiently diminished.

Step (10)

To render the polycrystalline silicon region 11b usable as a gate electrode, an ion impurity of phosphorus is injected into the polycrystalline silicon film 11b according to the ion implantation technique.

Step (11)

Figure 12:
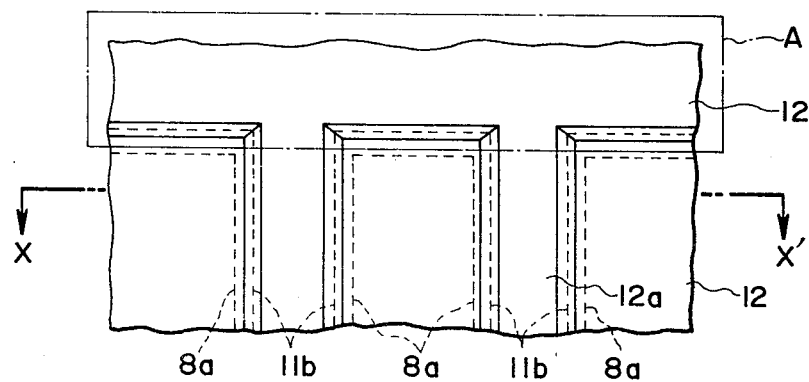
FIGS. 12 and 13 are partial plan views showing CCD prepared according to the present invention.

FIG. 12 is a plan view showing the structure of FIG. 11. Accordingly, an end portion of the polycrystalline silicon region 11b as the second layer (the portion surrounded by one-dot chain lines) is removed by the photoresist masking treatment. Etching removal of the end portion may be carried out just after the step (8).

FIG. 11 is a view showing the section taken along the line X—X' in FIG. 12.

In the above-mentioned embodiment of the present invention for the preparation of CCD, an MOS type element comprising the first-layer polycrystalline silicon film 8a as the gate electrode can be disposed very closely to an MOS element comprising the second-layer polycrystalline silicon region 11b as the gate electrode.

Furthermore, since there is no superimposed portion between the first-layer polycrystalline silicon film 8a and the second-layer polycrystalline silicon region 11b, the capacity load can be remarkably reduced. Accordingly, there can be obtained high-speed CCD with small power consumption.

Figure 13:
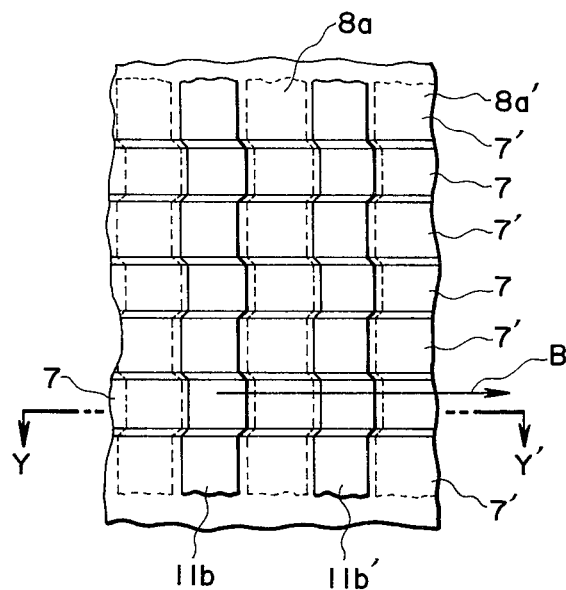

FIG. 13 is a partial plan view showing a 2-phase clock drive CCD prepared by the process illustrated in Example 2. For better illustration, the thin silicon oxide film 12a on the polycrystalline silicon regions 11b and 11b' is omitted in FIG. 13. The section taken along the line Y—Y' corresponds to the sectional view of FIG. 11. Referring to FIG. 13, a first clock pulse signal $\phi_1$ is given to the first-layer gate electrode 8a and the second-layer gate electrode 11b. A second clock pulse signal $\phi_2$ different from the first clock pulse signal $\phi_1$ in the phase is given to the first-layer gate electrode 8a' and the second-layer gate electrode 11b'. By these clock pulse signals $\phi_1$ and $\phi_2$, charges on the surface of the semiconductor substrate 6 are delivered in the direction indicated by arrow B. Reference numerals 7 and 7' represent a gate silicon oxide film and a thick field oxide film, respectively. The field oxide film 7' is formed according to, for example, the technique of local oxidation of silicon (hereinafter referred to as "LOCOS") prior to formation of the gate silicon oxide film 7.

EXAMPLE 3

This Example illustrates the method of a semiconductor device using an insulating film as an impurity source according to still another embodiment of the present invention. This embodiment is illustrated in FIGS. 14 through 21.

Step (1)

Figure 14:
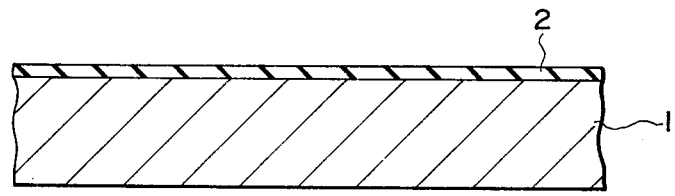
FIGS. 14 through 21 are sectional views illustrating the steps of another embodiment of the present invention.
Figure 15:
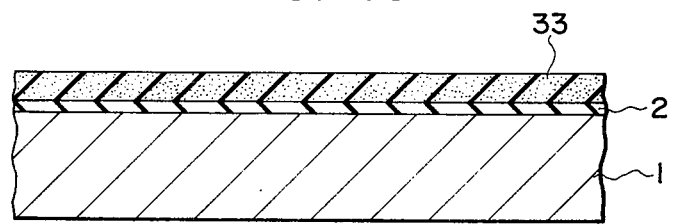

A semiconductor substrate 1 having a silicon oxide film 2 on the surface thereof is prepared (see FIG. 14).

Step (2)

An insulating film containing phosphorus as the impurity, for example, a phosphorus silicate glass (hereinafter referred to as "PSG") film 33, is formed on the surface of the silicon oxide film 2. Various substrates can be used in the present invention. For example, there may be used a substrate obtained by forming a silicon oxide film 2 on a silicon substrate on which a bipolar type or field effect type semiconductor element (transistor) having a PN junction, a substrate obtained by forming on a saphire substrate a semiconductor region for constituting a semiconductor element having a PN junction and forming an insulating film on the semiconductor region, and a silicon substrate having a silicon epitaxial layer.

The PSG film 33 acts as the impurity-containing region according to the present invention. It has a thickness of about 3000 Å and is formed according to the CVD method using a reaction gas comprising $SiH_4$, $PH_3$, $O_2$ and the like. The phosphorus concentration in the PSG film 33 is 10 to 15 mole %.

Step (3)

Figure 16:
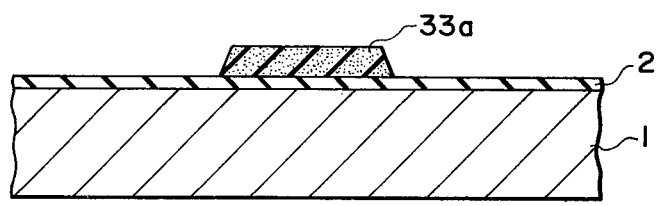

A photoresist film is formed on the surface of the PSG film 33, and a photoresist film having a predetermined pattern is formed according to the photoresist masking treatment and the PSG film 33 is etched by using the so formed photoresist film as the mask to form a PSG film 33a as shown in FIG. 16.

Step (4)

Figure 17:
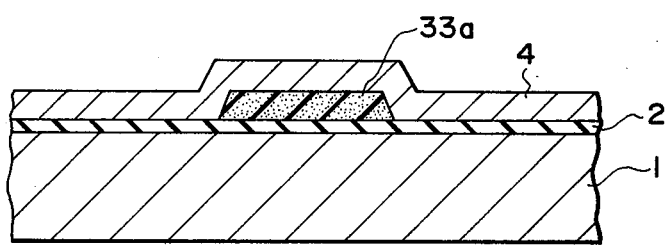

A non-doped polycrystalline silicon film 4 having a thickness of about 3000 Å is formed on the substrate 1 including the silicon oxide film 2 and the PSG film 33a according to the CVD method (see FIG. 17).

Step (5)

Figure 18:
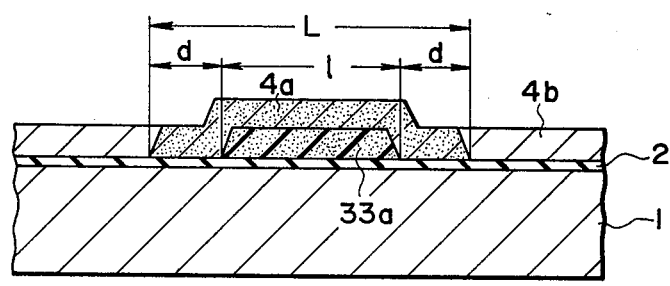

The heat treatment is carried out, for example, at 1000° C. in a nitrogen atmosphere for 60 minutes, to diffuse phosphorus as the impurity into the polycrystalline silicon film 4 from the PSG film 33a and form a polycrystalline silicon region 4a containing the phosphorus impurity (see FIG. 18). Also in this Example, as described in Example 1, there may be adopted a method in which the surface of the polycrystalline silicon film 4 is subjected in advance to light oxidation at 900° C. in a dry oxygen atmosphere for 30 minutes to form a thin film of silicon oxide on the surface of the polycrystalline silicon film 4 and the heat treatment is then carried out to form a polycrystalline silicon region 4a containing phosphorus as an impurity.

Step (6)

Figure 19:
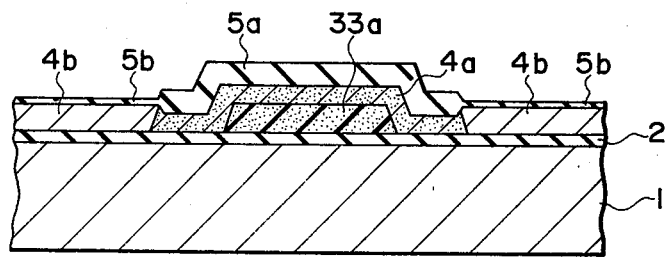
Figure 20:
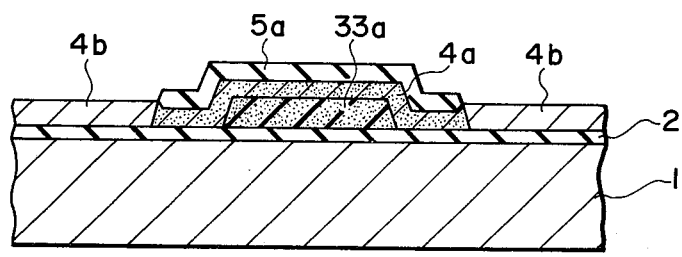

The surface portions of the polycrystalline silicon regions 4a and 4b are heat-oxidized at 750° C. in a wet oxygen atmosphere for 2 hours to form silicon oxide films 5a and 5b (see FIG. 19). The silicon oxide film 5b is formed by heat oxidation of the surface portion of the non-doped polycrystalline silicon region 4b and it has a thickness of about 400 Å. The silicon oxide film 5a is formed by heat oxidation of the surface portion of the phosphorus impurity-containing polycrystalline silicon region 4a and has a thickness larger than the thickness of the silicon oxide film 5b, that is, about 2500 Å. This difference of the thickness is manifested for the same reason as described in Example 1.

Step (7)

Etching is carried out by utilizing this difference of the thickness between the silicon oxide films 5a and 5b. More specifically, the silicon oxide films 5a and 5b are simultaneously etched according to plasma etching, chemical etching or the like, whereby the silicon oxide film 5b having a small thickness is removed while the silicon oxide film 5a having a large thickness is left (see FIG. 20).

Step (8)

Figure 21:
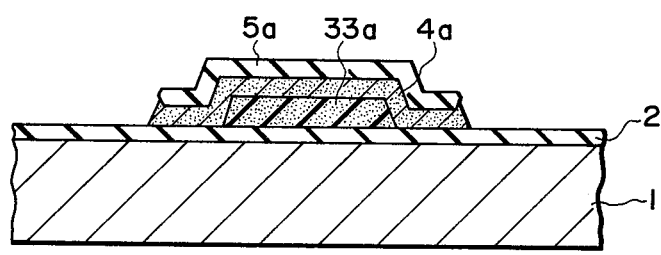

The surface-exposed polycrystalline silicon region 4b it etched and removed by using the silicon oxide film 5a as an etching mask to form a pattern on the phosphorus impurity-containing polycrystalline silicon region 4a below the silicon oxide film 5a (see FIG. 21).

This polycrystalline silicon region 4a contains the phosphorus impurity, and the impurity concentration is determined by conditions adopted in the treatment for diffusing the impurity from the PSG film 3. Accordingly, this polycrystalline silicon film 4a can be appropriately used as a region for a diode, a transistor or the like or as a bulk or wiring of a resistance element.

In this Example, the PSG film 33a containing phosphorus as an impurity is used as the impurity-containing region. There may be used an arsenic-containing glass film or a boron-containing insulating film, for example, a boron silicate glass (BSG) film, instead of the PSG film.

In this Example, the size L of the region 4a shown in FIG. 18 is determined according to the size l of the PSG film 33a and the lateral diffusion length d of the phosphorus impurity, and this diffusion length d can easily be controlled according to the heat treatment conditions or the kind of the impurity. Under the heat treatment conditions adopted in this Example (1000° C., 60 minutes in a nitrogen atmosphere), the diffusion length is about 1 μm, and the region 4a of a fine pattern can be formed with self-alignment based on the pattern of the PSG film 3.

EXAMPLE 4

In this Example, an embodiment in which the process described in Example 3 is applied to the preparation of a dynamic type NMOS memory cell device will be described by reference to FIGS. 22 through 31.

Step (1)

Figure 22:
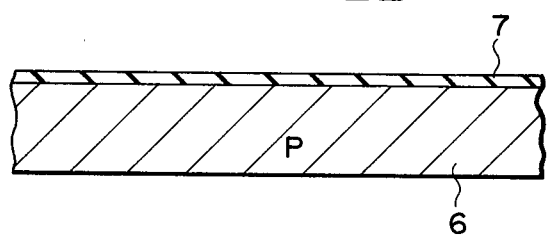
FIGS. 22 through 31 are sectional views illustrating the steps for preparing a memory cell device according to the present invention.

A P-type silicon substrate including a gate silicon oxide film 7 having a thickness of about 500 Å on the surface and having a specific resistance of 10 Ω-cm and a crystal face (100) is prepared (see FIG. 22).

Step (2)

Figure 23:
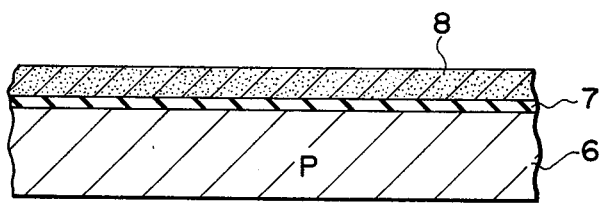

A polycrystalline silicon film having a thickness of about 4000 Å is formed on the surface of the gate silicon oxide film according to the CVD method, and phosphorus is heat-diffused in this polycrystalline silicon film to form a phosphorus-doped polycrystalline silicon film 8 having an impurity concentration of $1 \times 10^{21}$ atoms/$cm^3$ (see FIG. 23).

Step (3)

Figure 24:
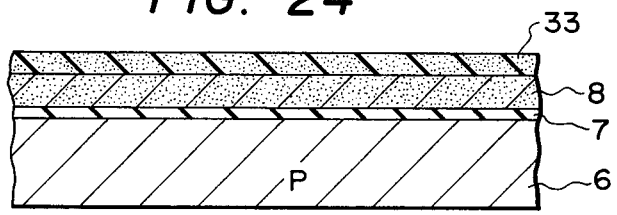
Figure 25:
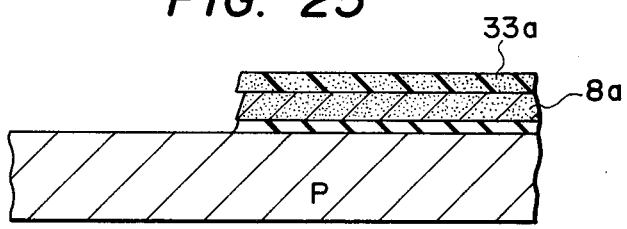
Figure 26:
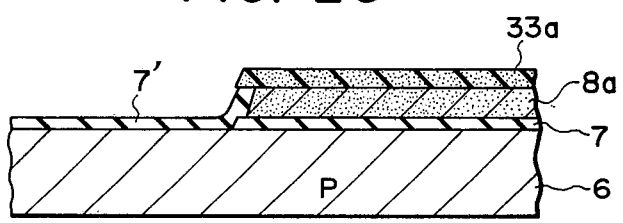

A phosphorus impurity-containing PSG film 33 having a thickness of about 3000 Å is formed on the surface of the polycrystalline silicon film 8 according to the CVD method using a reaction gas containing $SiH_4$, $PH_3$, $O_2$ and the like so that the phosphorus concentration in the film 33 is 10 to 15 mole % (see FIG. 24).

Step (4)

A photoresist film having a predetermined pattern (not shown) is formed on the surface of the PSG film 33. The PSG film 33 is selectively etched by using the photoresist film as a mask. Hydrofluoric acid (HF) is used as the etching solution. Then, the photoresist film is removed and the polycrystalline silicon film 8 is selectively etched by using the selectively etched PSG film 33a as a mask. A liquid mixture of hydrofluoric acid (HF), nitric acid ($HNO_3$) and glacial acetic acid ($CH_3COOH$) is used as the etching solution. Further, the gate oxide film 7 is selectively etched (see FIG. 25).

Step (5)

The exposed surface of the silicon substrate 6 is heat-oxidized at 850° C. in a wet oxygen atmosphere for 120 minutes to form a fresh gate oxide film 7' having a thickness of about 1000 Å on the surface of the silicon substrate 6. During this oxidation, a silicon oxide film having a thickness of about 4000 Å is formed on the side face of the polycrystalline silicon film 8a (see FIG. 26).

Step (6)

Figure 27:
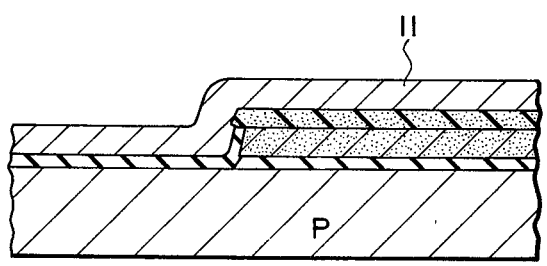

A non-doped polycrystalline silicon film 11 having a thickness of about 5000 Å is formed on the surfaces of the gate silicon oxide film 7' and the PSG film 33a according to the CVD method (see FIG. 27).

Step (7)

Figure 28:
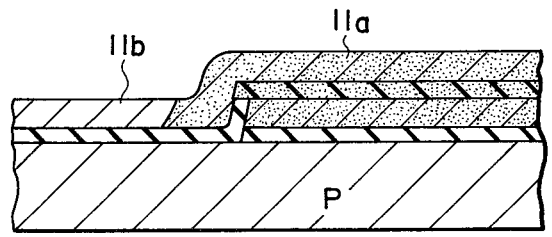

Heat oxidation is carried out at 1000° C. in a nitrogen atmosphere for about 60 minutes to diffuse the phosphorus impurity contained in the polycrystalline silicon film 8a into the polycrystalline silicon film 11 adjoining to the polycrystalline silicon film 8a, to form a phosphorus-doped polycrystalline silicon region 11a (see FIG. 28).

Step (8)

Figure 29:
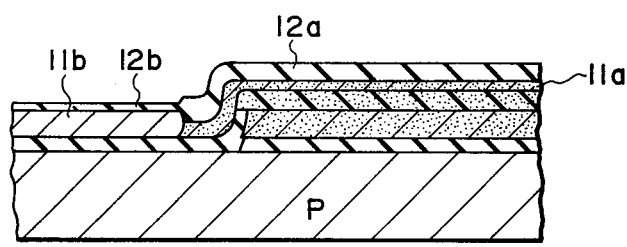
Figure 30:
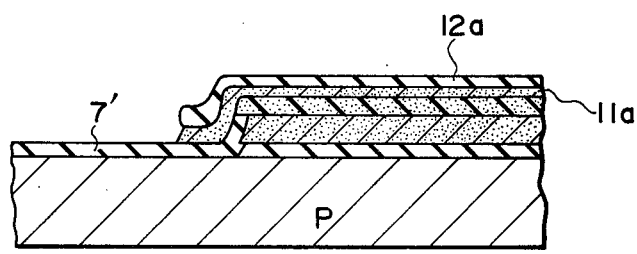

The surfaces of the polycrystalline silicon region 11b in which phosphorus has not been diffused and the phosphorus-containing polycrystalline silicon region 11a are subjected to low temperature oxidation at 750° C. in a wet oxygen atmosphere for about 4 hours to form a silicon oxide film 12b having a thickness of 500 Å on the surface of the region 11b and a silicon oxide film 12a having a thickness of 3500 Å on the surface of the region 11a (see FIG. 29).

Step (9)

The silicon oxide films 12a and 12b are simultaneously etched according to plasma etching, chemical etching or the like, and this etching operation is continued until the silicon oxide film 12b is completely removed. At this point, the silicon oxide film 12a having a larger thickness is still left. The polycrystalline silicon region 11b is etched and removed by using the remaining silicon oxide film 12a as a mask (see FIG. 30).

Step (10)

An impurity ion of arsenic is injected at an injection energy of about 80 KeV through the exposed surface of the gate silicon oxide film 7' by using the silicon oxide film 12a and polycrystalline silicon region 11a as masks. The dose of arsenic is $1 \times 10^{16}$ atoms/cm$^2$. Then, the annealing treatment is carried out at 1000° C. for 40 minutes to form an N+ type layer having a depth of about 0.3 μm.

Step (11)

After removal of the silicon oxide film 12a, a PSG film having a thickness of about 6000 Å is coated on the surfaces of the gate silicon oxide film 7' and the polycrystalline silicon region 11a (not shown).

One NMOS memory cell device including the N+ type layer as a data line, a gate area and a store area is prepared according to the above-mentioned procedures. The size of the gate area between the N+ type layer 20 and the store area is controlled by conditions of the heat treatment at the step (7). Therefore, an MOS transistor having a small width in the gate area can be conveniently prepared according to the process illustrated in this Example.

EXAMPLE 5

Figure 32:
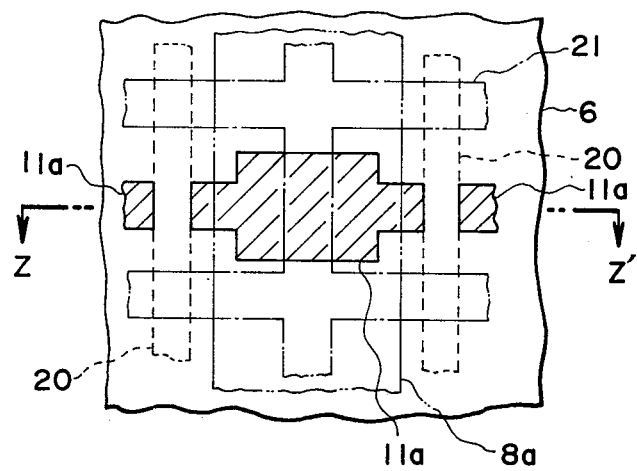
FIG. 32 is a plan view showing a memory cell device prepared according to the present invention.
Figure 33:
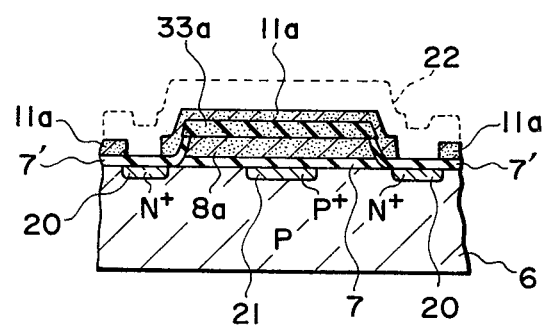
FIG. 33 is a view showing the section taken along the line Z—Z' in FIG. 32.

Two NMOS memory cell devices symmetric with each other, which are prepared according to the process illustrated in Example 4, are shown in FIGS. 32 and 33. FIG. 32 is a plan view and FIG. 33 is a view showing the section taken along the line Z—Z' in FIG. 32.

Figure 31:
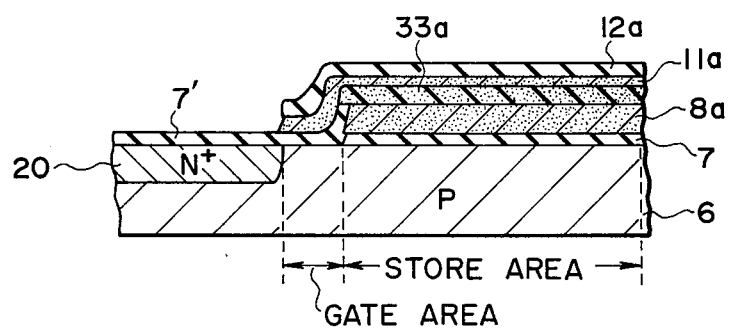

In FIGS. 32 and 33, the same materials as in FIG. 31 are represented by the same reference numerals. Reference numeral 21 represents a P+ type layer which is used as a channel stopper. This P+ type layer 21 is formed prior to formation of the gate silicon oxide film 7. A thick field silicon oxide film may be formed on this P+ type layer according to the technique of LOCOS. Reference numeral 22 represents a PSG film.

EXAMPLE 6

Figure 34:
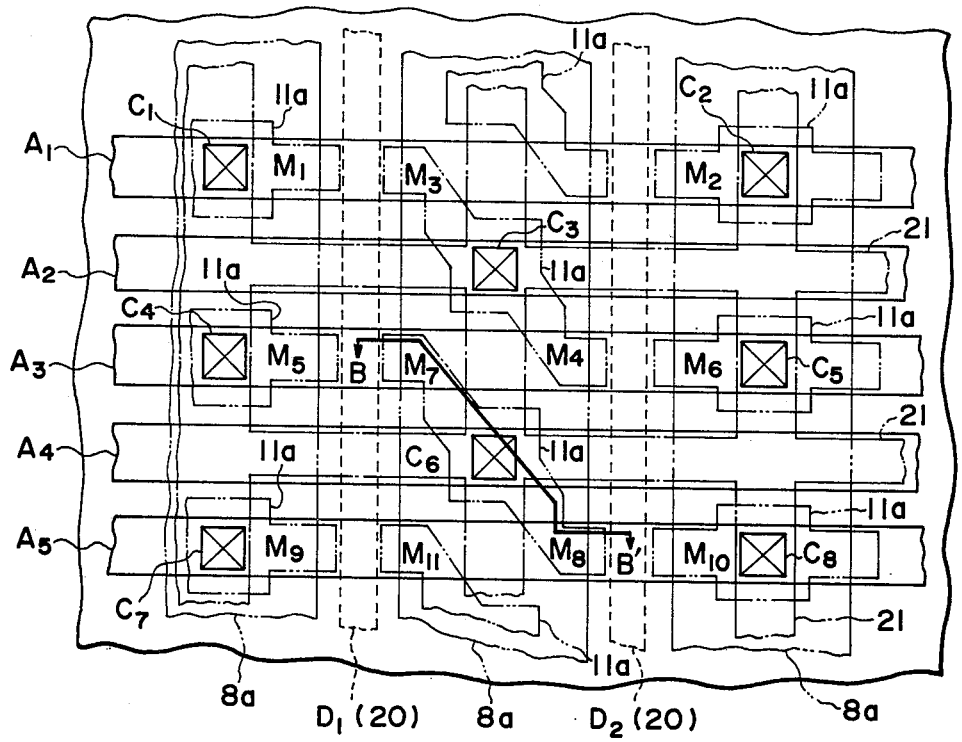
FIG. 34 is a partial plan view illustrating a 16K-bit memory cell array formed according to the present invention.
Figure 35:
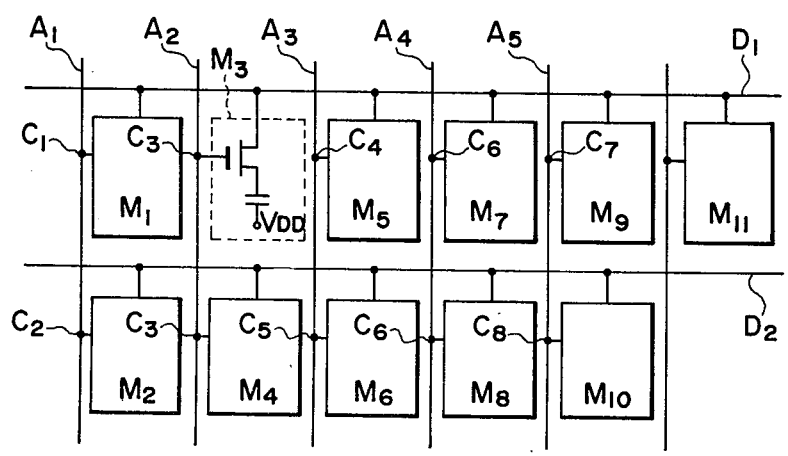
FIG. 35 is a circuit diagram of the memory cell array shown in FIG. 34.

FIG. 34 is a partial plan view showing a 16 K-bit dynamic type NMOS memory cell array prepared according to the process illustrated in Example 4, and FIG. 35 is a circuit diagram of this array.

In FIGS. 34 and 35, $A_1$ through $A_5$ are address lines composed of aluminum, $D_1$ and $D_2$ are data lines composed of N+ type layer 20, and $M_1$ through $M_{11}$ are memory cells, each comprising one MOSFET and one condenser. Referring to FIG. 34, a power source voltage Vdd (V) is supplied to the first-layer polycrystalline silicon layer 8a. $C_1$ through $C_8$ are contact regions where address lines $A_1$ through $A_5$ are connected to the second-layer polycrystalline silicon region 11a, and these contact regions $C_1$ through $C_8$ correspond to connecting points $C_1$ through $C_8$ in FIG. 35.

Figure 36:
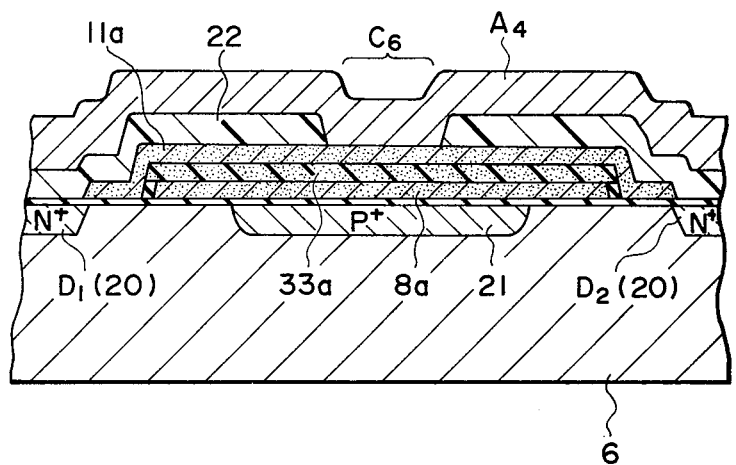
FIG. 36 is a view showing the section taken along the line B—B' in FIG. 34.

FIG. 36 in a view showing the section taken along the line B—B' in FIG. 34. The structure illustrated is not substantially different from the structure of the memory devices shown in FIG. 33.

The following points are taken into account in designing and laying out a highly integrated memory cell array as shown in FIG. 34.

(a) In one contact region, contact of the address line with polycrystalline silicon region for two memory cells is performed. For example, the contact region $C_6$ is used for contacting the address line A₄ with the polycrystalline silicon region 11a in the memory cells M₇ and M₈.

(b) A plurality of memory cells connected to one data line are located on the right and left sides along said data line. For example, the memory cells M₁, M₃, M₅, M₇, M₉ and M₁₁ connected to the data line D₁ are arranged along the data line D₁ (20) as shown in FIG. 34.

(c) The address line is extended onto as many memory cells as possible. For example, one address line A₃ is extended onto memory cells M₅, M₇, M₄ and M₆.

EXAMPLE 7

In this Example, the method of a semiconductor device according to still another embodiment the present invention will be described in sequence of steps by reference to FIGS. 37 through 42. In this Example, an impurity region formed in a semiconductor substrate is used as an impurity source.

Step (1)

Figure 37:
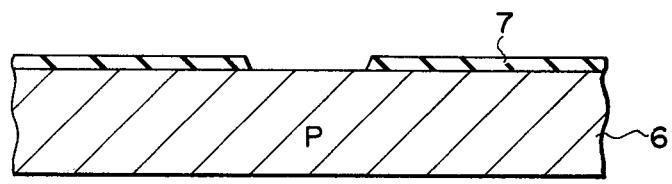
FIGS. 37 through 43 are sectional views showing the steps of still another embodiment of the present invention.

A P-type silicon substrate 6 having a silicon oxide film 7 formed on the surface thereof is prepared, and the silicon oxide film 7 is selectively etched and removed according to the photoresist masking treatment (see FIG. 37).

Step (2)

Figure 38:
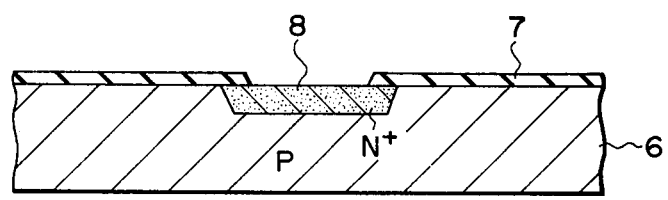

Phosphorus as an impurity is diffused in the silicon substrate 6 by using the etched silicon oxide film 7 as a mask to form an N⁺ type diffusion layer 8 having a high impurity concentration (see FIG. 38).

Step (3)

Figure 39:
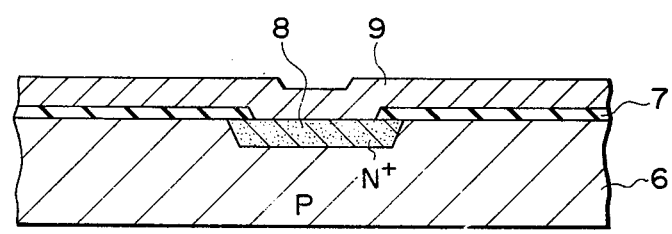

A non-doped polycrystalline silicon film 9 is formed on the entire surface of the silicon substrate 6 according to the procedure described in the Step (1) of Example 1 (see FIG. 39).

Step (4)

Figure 40:
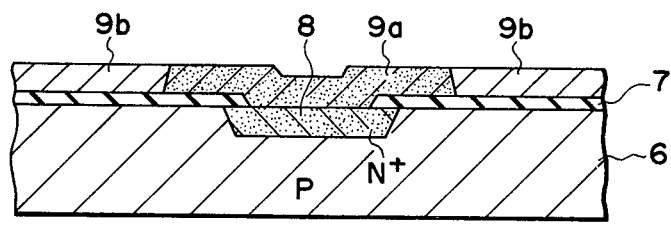

The phosphorus impurity is diffused from the N⁺ type diffusion layer 8 into the polycrystalline silicon film 9 by carrying out a heat treatment at 950° C. in a nitrogen atmosphere for about 30 minutes to form a phosphorus-doped polycrystalline silicon region 9a (see FIG. 40).

Step (5)

Figure 41:
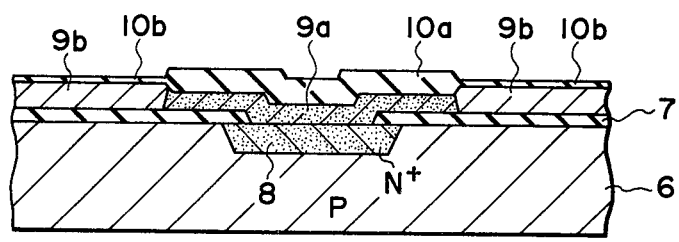
Figure 42:
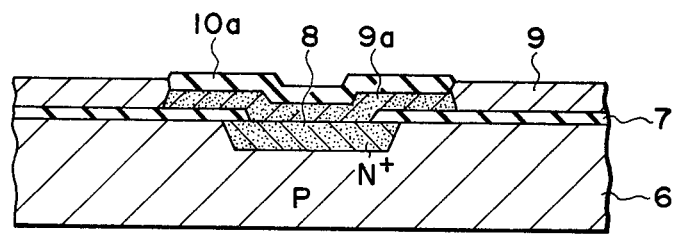

The surfaces of the polycrystalline silicon region 9b in which phosphorus has not been diffused and the phosphorus-containing polycrystalline silicon region 9a are subjected to low temperature oxidation at 750° C. in a wet oxygen atmosphere for about 4 hours to form a silicon oxide film 10b having a thickness of 500 Å on the surface of the polycrystalline silicon region 9b and a silicon oxide film 10a having a thickness of 3500 Å on the surface of the polycrystalline silicon region 9a (see FIG. 41).

Step (6)

The silicon oxide films 10a and 10b are simultaneously etched according to plasma etching, chemical etching or the like until the silicon oxide film 10b is completely removed. At this point, the silicon oxide film 10a having a larger thickness is still left (see FIG. 42).

Step (7)

Figure 43:
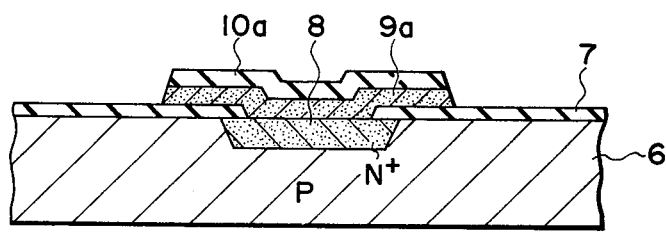

The polycrystalline silicon film 9b is etched and removed by using the remaining silicon oxide film 10a as a mask (see FIG. 43). Then, the silicon oxide film 10a is etched and removed. The silicon oxide film 10a may be partially left according to need.

The phosphorus-doped polycrystalline silicon region 9a is an impurity-containing film of a fine pattern having ohmic contact with the N⁺ type layer 8. Accordingly, this phosphorus-doped polycrystalline silicon region 9a can be used as an ohmic electrode or resistance element.

As the semiconductor device that can be prepared according to the process illustrated in this Example, there can be mentioned a diode device, and moreover, this process is suitable for formation an emitter region and an electrode thereof in a bipolar transistor, especially a transistor for high-frequency small signals.

In each of the foregoing Examples 1 through 7, an impurity is selectively introduced into a semiconductor layer that is to be used as an electrode to form an impurity-doped semiconductor region and a non-doped semiconductor region, and oxide films differing in the thickness are formed on these two regions by utilizing the difference of the oxidation speed between the two regions. An electrode is formed by utilizing this difference of the thickness between the two oxide films. Embodiments according to the basic concept of the present invention will be described in subsequent Examples.

Example 8

In this Example, a still further embodiment of the present invention will be described in sequence of steps by reference to FIGS. 44 through 49.

Step (1)

Figure 44:
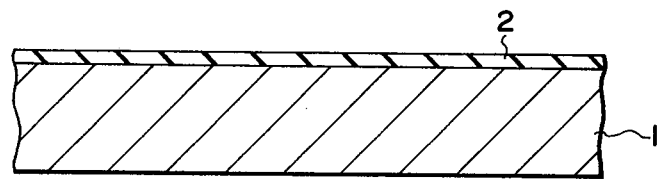
FIGS. 44 through 49 are sectional views showing the steps of a further embodiment of the present invention.

A silicon substrate 1 having a silicon oxide film 2 is prepared (see FIG. 44).

Step (2)

Figure 45:
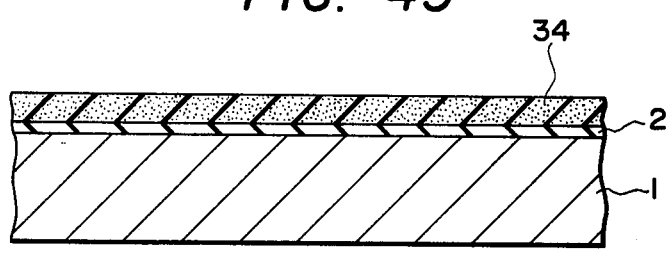

A boron silicate glass (BSG) film 34 containing boron is formed on the surface of the silicon oxide film 2 (see FIG. 45). The BSG film 34 is an insulating film acting as an impurity-containing region. For the reason set forth hereinafter, the boron concentration in the BSG film 34 should be at least $5 \times 10^{19}$ atoms/cm³. This BSG film 34 can easily be formed according to the CVD method or the like.

Step (3)

Figure 46:
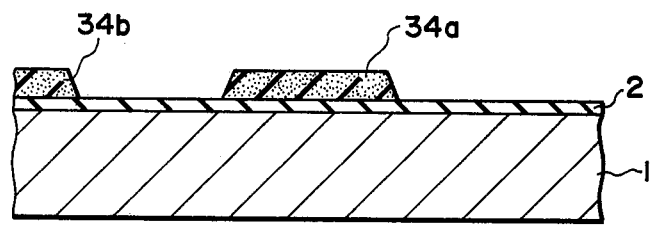

A photoresist film having a predetermined pattern is formed on the surface of the BSG film 34, and the BSG film 34 is etched by using this photoresist film as a mask to form BSG films 34a and 34b having a desirable shape (see FIG. 46).

Step (4)

Figure 47:
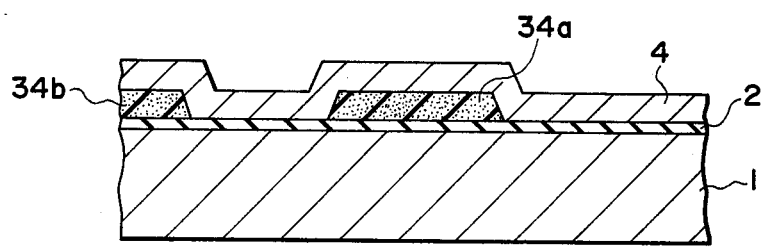

A polycrystalline silicon film 4 having a thickness of about 3000 Å is formed on the silicon substrate 1 including the BSG films 34a and 34b according to the CVD method (see FIG. 47).

Step (5)

Figure 48:
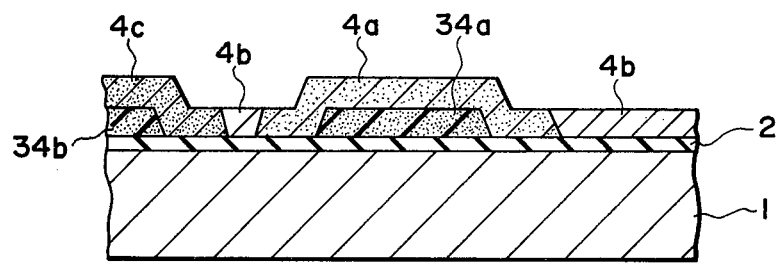

A heat treatment is carried out, for example, at 1000° C. in a nitrogen atmosphere for 60 minutes, to diffuse boron into the polycrystalline silicon film 4 from the BSG films 34a and 34b to form boron-doped polycrystalline silicon regions 4a and 4c (see FIG. 48).

At this step, there may be adopted a method in which as described in the Step (3) of Example 1, the surface of the polycrystalline silicon film 4 is subjected in advance to light oxidation at 900° C. in a dry oxygen atmosphere for 30 minutes to form a thin silicon oxide film on the surface of the polycrystalline silicon film 4 and then, the heat treatment is carried out to form boron-containing polycrystalline silicon regions 4a and 4c.

Step (6)

Figure 49:
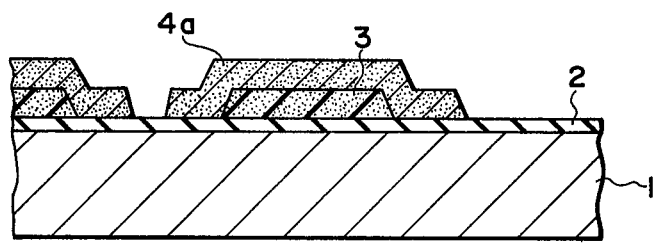

The polycrystalline silicon film is subjected to such an etching treatment that the etching speed to the boron-containing polycrystalline silicon regions 4a and 4c of the polycrystalline silicon film is very low and the etching speed to the boron-free polycrystalline silicon region 4b is high, whereby only the boron-free polycrystalline silicon region 4b is removed by etching while the boron-containing polycrystalline silicon regions 4a and 4c are left (see FIG. 49).

When a chemical etching method is adopted for this etching treatment, if, for example, a liquid mixture comprising ethylene diamine (17 moles), water (8 moles) and pyrocatechol (3 g) is used as the etching solution, the above-mentioned selective etching can be accomplished with the boron concentration of about $5 \times 10^{19}$ atoms/cm$^3$ being as a boundary.

In the boron-containing polycrystalline regions 4a and 4c, the concentration of boron as the impurity can be controlled to a desirable level, and these regions may be formed into conductors having a desirable value of the electric resistance. Accordingly, these regions can be used as resistance elements.

In this Example, the boron-containing BSG film is used as the impurity-containing region, but the insulating film that can be used in the present invention is not limited to this boron-containing BSG film. For example, a conductive material such as boron-doped polycrystalline silicon may be used as the impurity-containing region.

Instead of the polycrystalline silicon film 4 that is used in this Example, there may be employed a polycrystalline silicon film containing platinum or molybdenum, a non-doped monocrystalline silicon film or a monocrystalline silicon film containing an impurity at a low concentration.

Example 9

In this Example, an impurity-containing region formed in a semiconductor substrate is used as the impurity source as in Example 7.

Step (1)

Figure 50:
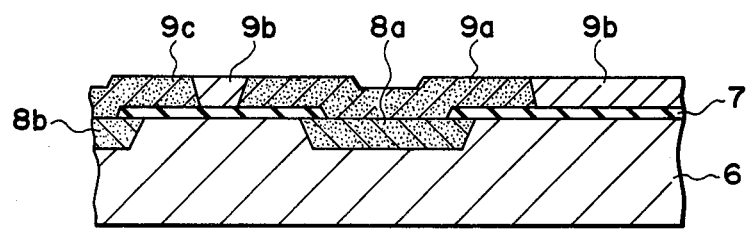
FIGS. 50 and 51 are sectional views showing the steps of a still further embodiment of the present invention.

A semiconductor substrate shown in FIG. 50 is prepared according to the same procedures as described in the Steps (1) through (4) of Example 7. In FIG. 50, the substrate 6 is composed of N-type silicon, and reference numerals 8a and 8b represents a P+ type layer containing boron at a high concentration. Accordingly, polycrystalline silicon regions 9a and 9c contain boron as the impurity.

Step (2)

Figure 51:
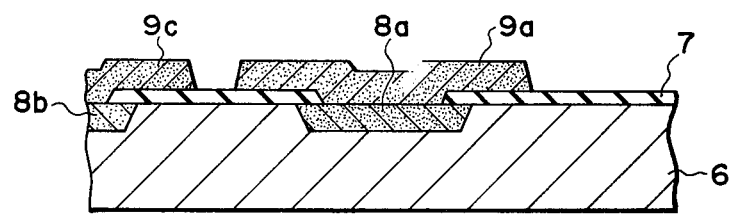

The etching treatment is carried out in the same manner as described in the Step (6) of Example 8 (see FIG. 51).

Among the foregoing Examples, Examples 1 through 7 utilize the physical characteristic that the oxidation speed is different between the impurity-containing semiconductor region and the impurity-free semiconductor region, that is, the oxidation speed of the former region is higher than the oxidation of the latter region. This physical characteristic will now be described by reference to experimental results shown in FIGS. 52 through 54.

Figure 52:
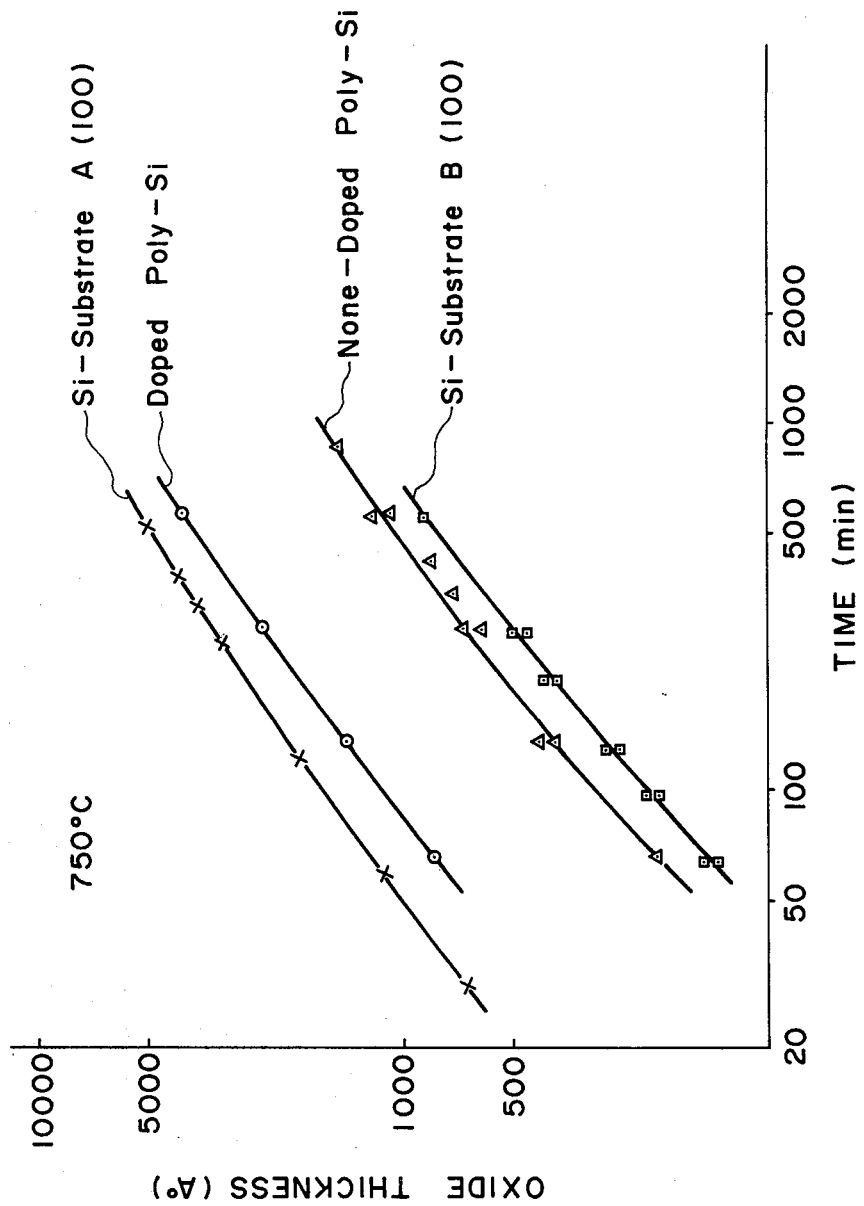
FIGS. 52 and 53 are diagrams illustrating the relation between the oxidation time and the thickness of the oxide film, observed when the surfaces of doped poly-Si, non-doped poly-Si and silicon substrate are oxidized.

A silicon substrate A containing phosphorus as an impurity at a concentration of $7 \times 10^{20}$ atoms/cm$^3$, doped polycrystalline silicon (doped poly-Si) containing phosphorus as an impurity at a concentration of $3 \times 10^{20}$ atoms/cm$^3$, non-doped polycrystalline silicon (non-doped poly-Si) and a silicon substrate B containing boron as an impurity at a concentration of $1 \times 10^{15}$ atoms/cm$^3$ are subjected to surface oxidation at 750° C. in a wet oxygen atmosphere. The relations between the oxidation time and the thickness of the resulting oxide film, observed with respect to these samples, are shown in FIG. 52. The foregoing samples are similarly subjected to surface oxidation at 850° C. in a wet oxygen atmosphere, and the observed relations between the oxidation time and the thickness of the resulting oxide film are shown in FIG. 53.

Figure 53:
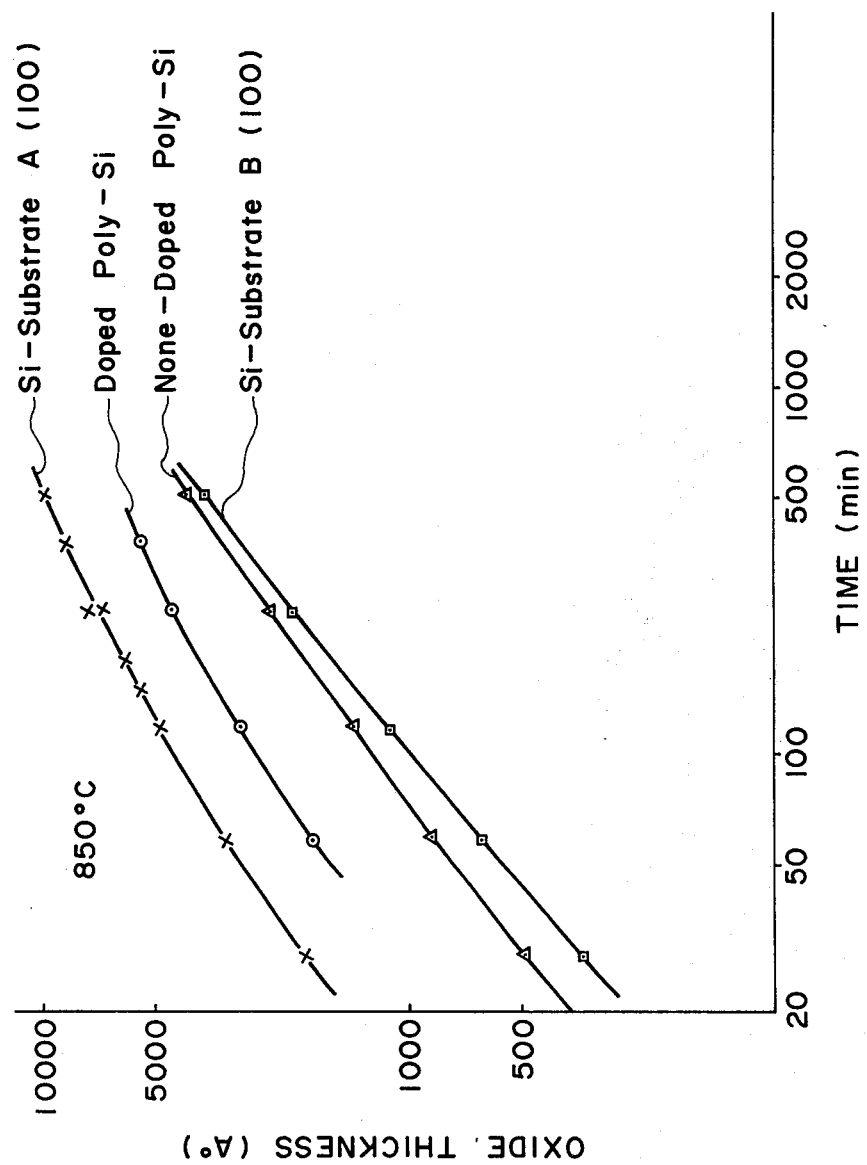

As will readily be understood from the results shown in FIGS. 52 and 53, the oxidation speed of doped poly-Si is much higher than non-doped poly-Si. Incidentally, each of the silicon substrates A and B is a monocrystalline silicon substrate having a crystal face (100). These substrates are tested so as to compare properties of polycrystalline silicon (poly-Si) with properties of monocrystalline silicon.

Figure 54:
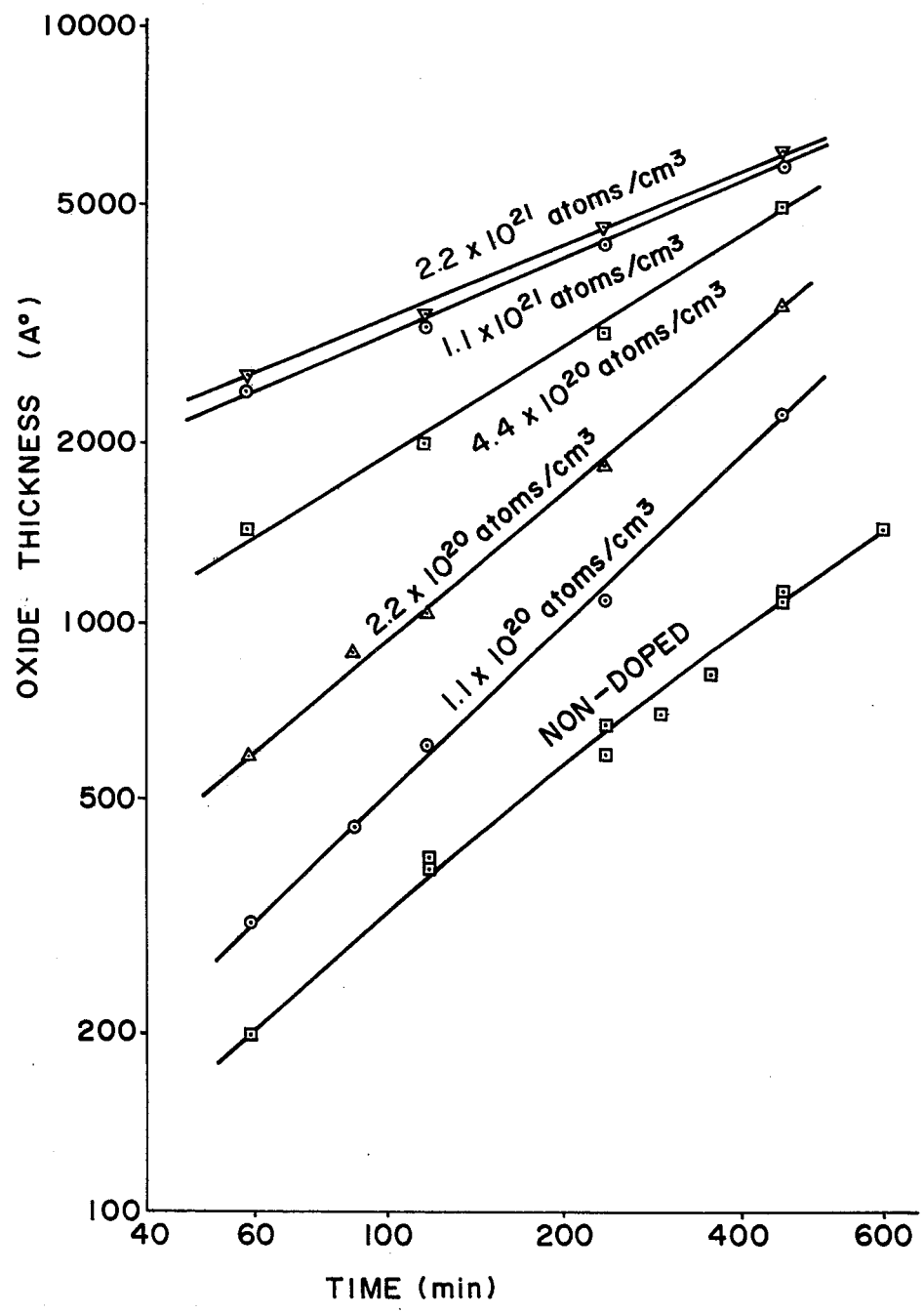
FIG. 54 is a diagram illustrating the relation between the oxidation time and the thickness of the oxide film, observed when various polycrystalline silicon layers differing in the concentration of a doped phosphorus impurity are oxidized.

The relations between the oxidation time and the thickness of the oxide film, observed with respect to polycrystalline silicon films differing in the concentration of phosphorus as the impurity are shown in FIG. 54. The oxidation is carried out at 750° C. in a wet oxygen atmosphere. As will be apparent from FIG. 54, the oxidation speed varies depending on the impurity concentration. In the foregoing Examples, the non-doped polycrystalline silicon film is used as the second-layer polycrystalline silicon film, but as will readily be understood from FIG. 54, an impurity may be contained in the second-layer polycrystalline silicon film. In short, the most characteristic feature of the present invention is that regions differing in the impurity concentration are formed in one polycrystalline silicon film.

Examples 8 and 9 utilize the physical characteristic that the etching speed is different between the impurity-containing semiconductor region and the impurity-free semiconductor region. More specifically, Examples 8 and 9 are based on the experimental finding that the etching speed of the boron-free polycrystalline silicon region is about 10 times as high as the etching speed of the boron-containing polycrystalline silicon region, though this difference of the etching speed varies to some extent depending on the kind of the etching solution.

The effects of the present invention illustrated in the foregoing Examples will now be summarized.

(A) In preparing a semiconductor device, especially forming an electrode or wiring layer, according to the process of the present invention, no margin is necessary for mask registering which is indispensable for the photoresist masking treatment. Accordingly, fine electrodes or wiring layers can be effectively formed with ease. Furthermore, according to the present invention, the size of electrodes or wiring layers can easily be controlled by adjusting the degree of diffusion of the impurity.

Therefore, a semiconductor integrated circuit having a high degree of integration or a semiconductor element having a fine structure can easily be prepared according to the process of the present invention.

(B) Since a semiconductor is used as an electrode or wiring layer, a part thereof can be used as a resistance element.

(C) Since polycrystalline silicon is used as an electrode or wiring layer, the speed of diffusion of the impurity can be increased and the size of the electrode or wiring layer can easily be controlled and determined.

(D) As illustrated in Example 2, the spacing between electrodes can be remarkably diminished and no superimposed portion of electrodes is formed. Accordingly, high-speed CCD with a much reduced power consumption can be prepared.

(E) As illustrated in Example 4, since the width of the gate region can be narrowed, a high-speed memory cell can be prepared very easily.

What is claimed is:

1. A method for fabricating a semiconductor device which comprises the steps of forming an impurity-containing layer over a certain region of a substrate, forming a semiconductor layer over another region of the substrate and contiguous to the impurity-containing layer, and doping the impurity contained in the impurity-containing layer into the semiconductor layer to selectively form an impurity-containing semiconductor region, contiguous to the impurity-containing layer, and an impurity-free semiconductor region in the semiconductor layer, wherein said impurity-containing layer and the impurity-free semiconductor region in the semiconductor layer are spaced from each other by said impurity-containing semiconductor region.

2. A method according to claim 1 wherein the impurity-containing layer is an impurity-containing semiconductor layer.

3. A method according to claim 2 which further comprises a step of simultaneously oxidizing the surfaces of the impurity-containing semiconductor region and the impurity-free semiconductor region to form a first oxide film on the impurity-containing semiconductor region and a second oxide film on the impurity-free semiconductor region.

4. A method according to claim 3 wherein the oxide film-forming step includes a step of completely converting the impurity-containing semiconductor region to a second oxide film.

5. A method according to claim 3 wherein the thickness of the first oxide film is larger than the thickness of the second oxide film.

6. A method according to claim 5 which further comprises steps of simultaneously etching the first and second oxide films to expose the surface of the impurity-free semiconductor region and removing the impurity-free semiconductor region by using the remaining first oxide film as a mask.

7. A method according to claim 6 wherein after the step of removing the impurity-free semiconductor region, an impurity is doped into the substrate by using the impurity-containing semiconductor region as a mask.

8. A method according to claim 2 which further comprises a step of simultaneously etching the impurity-containing semiconductor region and the impurity-free semiconductor region to leave only the impurity-containing semiconductor region.

9. A method for fabricating a semiconductor device which comprises the steps of forming an oxide film on the surface of a semiconductor substrate, forming an impurity-containing layer selectively on a certain region of the oxide film, forming a semiconductor layer on another region of the oxide film, and contiguous to the impurity-containing layer, and doping the impurity contained in the impurity-containing layer selectively into the semiconductor layer to form an impurity-containing semiconductor region contiguous to the impurity-containing layer and to form an impurity-free semiconductor region in the semiconductor layer, wherein the impurity-free semiconductor region of the semiconductor layer and the impurity-containing layer are spaced from each other by said impurity-containing semiconductor region.

10. A process according to claim 9 wherein the impurity-containing layer is an impurity-containing semiconductor layer.

11. A method according to claim 9 wherein the semiconductor layer is comprised of non-doped polycrystalline silicon.

12. A method for the preparation of semiconductor devices, which comprises the steps of forming an impurity-containing layer selectively over a certain region of a semiconductor substrate, forming a first layer over another region of the semiconductor substrate and contiguous to the impurity-containing layer, and doping the impurity contained in the impurity-containing layer selectively into the first layer to form an impurity-containing region contiguous to the impurity-containing layer and an impurity-free region, wherein said impurity-containing layer and said impurity-free region are spaced from each other by said impurity-containing region.

13. A method for fabricating a semiconductor device, which comprises steps of forming an impurity-containing region over a substrate, forming a coating composed mainly of silicon so that said coating covers at least a part of the impurity-containing region, diffusing the impurity contained in the impurity-containing layer into the coating adjoining to the impurity-containing layer to form an impurity-containing portion in said coating, heat-oxidizing said coating composed mainly of silicon to form an oxide film on the surface of the impurity-containing portion of said coating and also form on the surface of the impurity-free portion of said coating an oxide film having a thickness smaller than the thickness of the oxide film formed on the surface of the impurity-containing portion, and selectively removing the impurity-free coating of the impurity-free portion while leaving the impurity-containing coating of the impurity-containing portion.

14. A method according to claim 13 wherein the impurity-containing region is comprised of an impurity-containing insulating film.

15. A method according to claim 13 wherein the impurity-containing region is comprised of an impurity-containing semiconductor.

16. A method according to claim 13 wherein the impurity contained in the impurity-containing region is phosphorus.

17. A method according to claim 13 wherein the impurity contained in the impurity-containing region is boron.

18. A method for fabricating a semiconductor devices, which comprises steps of forming a first film containing an impurity and being comprised mainly of silicon on a part of the surface of a substrate, forming a second film comprised mainly of silicon on the surface of the substrate to cover the first film, performing a heat treatment to diffuse the impurity contained in the first film into the adjoining second film and form a region containing the impurity at a part of the second film, and heat-oxidizing parts of said first and second films to electrically separate at least the first film from the second film by an oxide film formed by the heat oxidation.

19. A method according to claim 18 wherein each of the first and second films is comprised of polycrystalline silicon.

20. A method for fabricating a semiconductor devices, which comprises steps of forming an impurity-containing region containing boron as an impurity over a substrate, forming a film composed mainly of silicon to cover at least a part of the surface of said impurity-containing region, diffusing boron contained in the impurity-containing region into the adjoining coating to form a boron-containing portion in said coating, and carrying out such an etching treatment that the coating is removed from the boron-free portion while leaving at least a part of the coating of said boron-containing portion.

21. A method according to claim 20 wherein the etching treatment is carried out by using an etching solution containing pyrocatechol and ethylene diamine.

22. A method according to claim 20 wherein the impurity-containing region is comprised of an insulating film containing boron.

23. A method according to claim 20 wherein the impurity-containing region is comprised of a semiconductor containing boron.

* * * * *